(12) United States Patent
Sandow et al.

(10) Patent No.: US 9,819,341 B2
(45) Date of Patent: Nov. 14, 2017

(54) SEMICONDUCTOR DEVICES

(71) Applicant: Infineon Technologies AG, Neubiberg (DE)

(72) Inventors: Christian Philipp Sandow, Haar (DE); Franz-Josef Niedernostheide, Hagen a. T.W. (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/223,581

(22) Filed: Jul. 29, 2016

(65) Prior Publication Data

US 2017/0033794 A1    Feb. 2, 2017

(30) Foreign Application Priority Data

Jul. 30, 2015    (DE) ........................ 10 2015 112 502

(51) Int. Cl.
| | | |
|---|---|---|
| *H03K 3/00* | (2006.01) | |
| *H03K 17/687* | (2006.01) | |
| *H01L 23/48* | (2006.01) | |
| *H01L 23/482* | (2006.01) | |
| *H01L 23/00* | (2006.01) | |
| *H01L 25/18* | (2006.01) | |
| *H01L 27/02* | (2006.01) | |
| *H01L 29/739* | (2006.01) | |
| *H01L 29/74* | (2006.01) | |
| *H01L 29/78* | (2006.01) | |

(52) U.S. Cl.
CPC ......... *H03K 17/687* (2013.01); *H01L 23/481* (2013.01); *H01L 23/482* (2013.01); *H01L 24/05* (2013.01); *H01L 24/16* (2013.01); *H01L 25/18* (2013.01); *H01L 27/0251* (2013.01); *H01L 29/7395* (2013.01); *H01L 29/74* (2013.01); *H01L 29/7802* (2013.01); *H01L 29/7827* (2013.01); *H01L 2224/05025* (2013.01); *H01L 2224/16146* (2013.01)

(58) Field of Classification Search
None
See application file for complete search history.

(56) References Cited

U.S. PATENT DOCUMENTS

| | | |
|---|---|---|
| 5,616,945 A | 4/1997 | Williams |
| 6,919,643 B2 | 7/2005 | Wheeler et al. |

(Continued)

FOREIGN PATENT DOCUMENTS

DE    102008044411 B4    6/2015

OTHER PUBLICATIONS

Otsuki, Masahito et al., "Trends and Opportunities in Intelligent Power Modules (IPM)", Proceedings of the 27th International Symposium on Power Semiconductor Devices & IC's, May 10-14, 2015, Kowloon Shangri-La, Hong Kong, pp. 317-320.

*Primary Examiner* — Lincoln Donovan
*Assistant Examiner* — Khareem E Almo
(74) *Attorney, Agent, or Firm* — Murphy, Bilak & Homiller, PLLC

(57) ABSTRACT

A semiconductor device includes a first transistor cell of a plurality of transistor cells of a vertical field effect transistor arrangement, and a second transistor cell of the plurality of transistor cells. The first transistor cell and the second transistor cell are electrically connected in parallel. A gate of the first transistor cell and a gate of the second transistor cell are controllable by different gate control signals.

20 Claims, 6 Drawing Sheets

(56) References Cited

U.S. PATENT DOCUMENTS

| | | | |
|---|---|---|---|
| 8,604,560 B2 * | 12/2013 | Reynes | H01L 29/0696 257/401 |
| 9,343,507 B2 * | 5/2016 | Takaki | H01L 27/2481 |
| 9,620,512 B1 * | 4/2017 | Nishikawa | H01L 27/11524 |
| 2007/0085187 A1 | 4/2007 | Sun et al. | |
| 2011/0198587 A1 | 8/2011 | Takeuchi | |
| 2011/0227146 A1 * | 9/2011 | Reynes | H01L 29/1095 257/328 |
| 2012/0126313 A1 * | 5/2012 | Braithwaite | H01L 29/42372 257/329 |

* cited by examiner

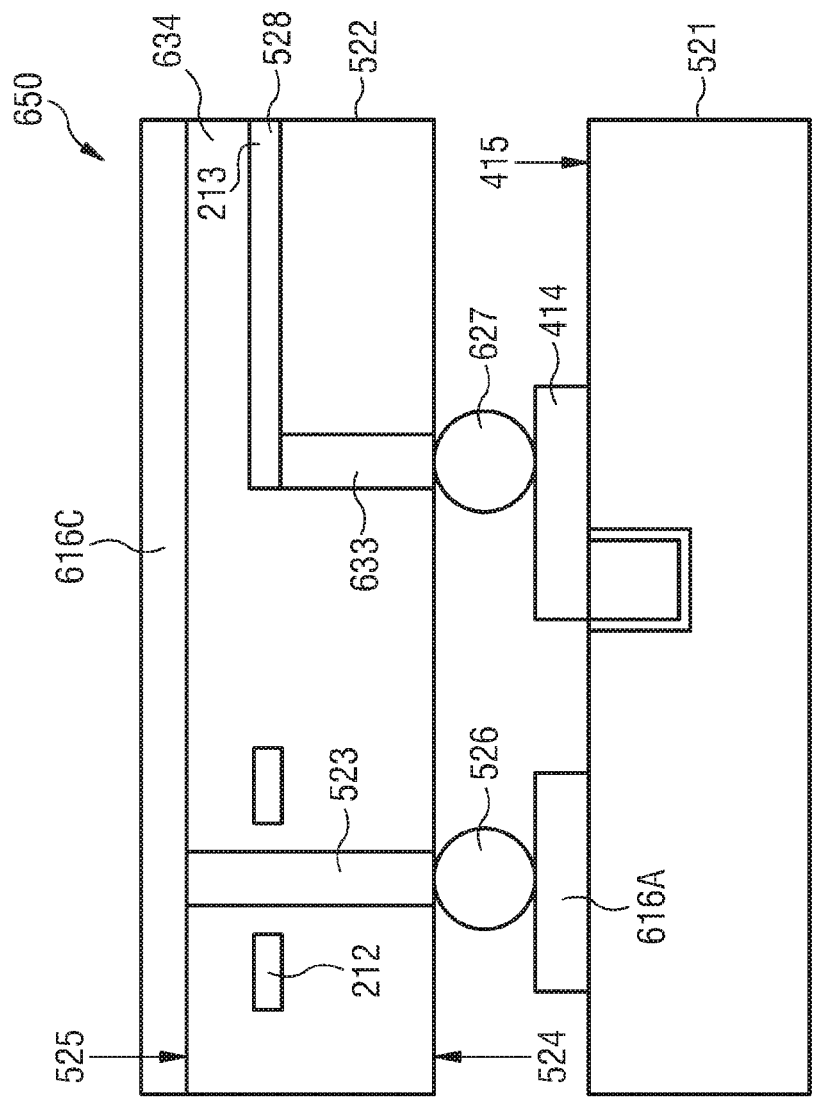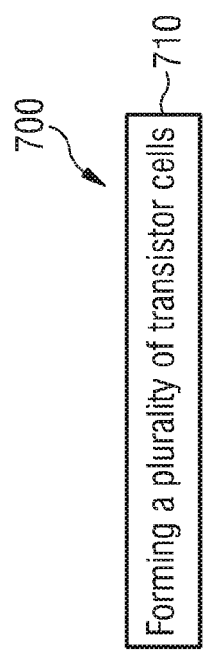

SEMICONDUCTOR DEVICES

TECHNICAL FIELD

Embodiments relate to concepts for power transistor structures, and in particular to semiconductor devices.

BACKGROUND

A power class of a power switch of a semiconductor device may be tailored to accommodate maximum expected load currents under operating conditions. Under some operating conditions, semiconductor devices may not provide their full potential performance.

SUMMARY

Some embodiments relate to a semiconductor device. The semiconductor device comprises a first transistor cell of a plurality of transistor cells of a vertical field effect transistor arrangement. The semiconductor device further comprises a second transistor cell of the plurality of transistor cells. The first transistor cell of the plurality of transistor cells and the second transistor cell of the plurality of transistor cells are electrically connected in parallel. A gate of the first transistor cell and a gate of the second transistor cell are controllable by different gate control signals.

Some embodiments relate to a further semiconductor device. The semiconductor device comprises a plurality of transistor cells. The semiconductor device further comprises a sensing circuit configured to determine a current or a temperature through at least one transistor cell of the plurality of transistor cells. The semiconductor device further comprises a controller module configured to generate a gate control signal for controlling a subset of the plurality of transistor cells based on the determined current through the at least one transistor cell.

Some embodiments relate to a further semiconductor device. The semiconductor device comprises a plurality of transistor cells of a vertical field effect transistor arrangement. A gate of a first transistor cell of the plurality of transistor cells and a gate of a second transistor cell of the plurality of transistor cells are controllable by different gate control signals. A blocking voltage of the vertical field effect transistor arrangement is at least 10 V.

Some embodiments relate to a further semiconductor device. The semiconductor device comprises a first semiconductor chip comprising at least one transistor cell. The semiconductor device further comprises a second semiconductor chip comprising a controller module for controlling a gate of the at least one transistor cell. The second semiconductor chip comprises an electrically conductive via structure extending between a first side surface of a semiconductor substrate of the second semiconductor chip towards a second side surface of the semiconductor substrate of the second semiconductor chip.

The electrically conductive via structure is connected to the at least one transistor cell of the first semiconductor chip through a flip-chip connection structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6B shows a schematic illustration of a further semiconductor device including two semiconductor chips.

FIG. 7 shows a flow chart of a method for controlling a vertical field effect transistor arrangement of a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
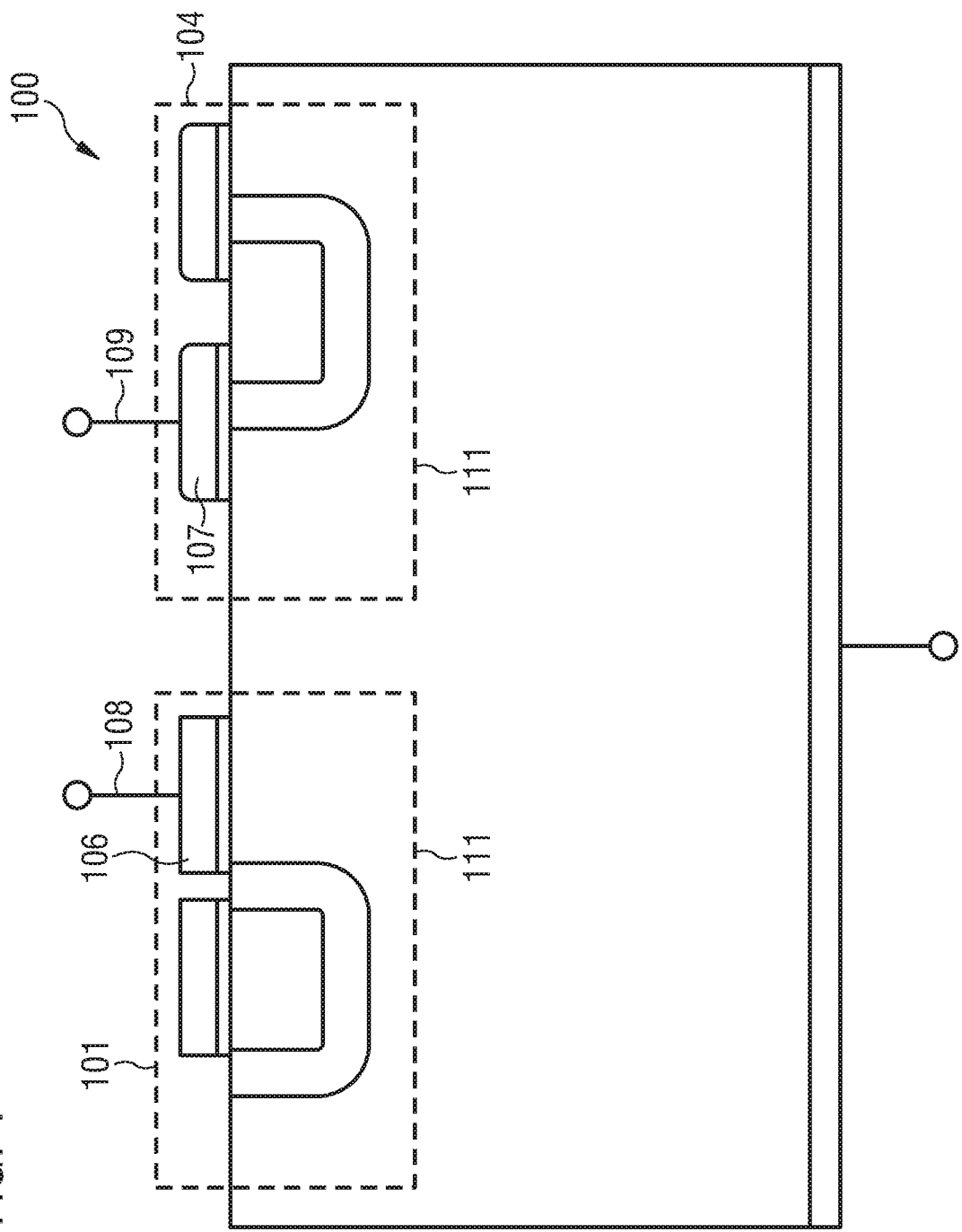
FIG. 1 shows a schematic illustration of a semiconductor device.

FIG. 1 shows a schematic illustration of a semiconductor device 100 according to an embodiment.

The semiconductor device 100 comprises a first transistor cell 101 of a plurality of transistor cells 111 of a vertical field effect transistor (FET) arrangement.

The semiconductor device 100 further comprises a second transistor cell 104 of the plurality of transistor cells 111.

The first transistor cell 101 of the plurality of transistor cells 111 and the second transistor cell 104 of the plurality of transistor cells 111 are electrically connected in parallel.

A gate 106 of the first transistor cell 101 and a gate 107 of the second transistor cell 104 are controllable by different gate control signals 108, 109.

Due to the gate 106 of the first transistor cell 101 and the gate 107 of the second transistor cell being controllable by different gate control signals 108, 109, switching losses (e.g. due to over-voltage) may be reduced, for example. For example, the transistor cells may be dynamically adapted to the different load currents.

The gate 106 of the first transistor cell 101 may be controlled by a first gate control signal 108 and the gate 107 of the second transistor cell 104 may be controlled by a second (different) gate control signal 109. For example, the first transistor cell 101 and the second transistor cell 104 may be switchable at different times (e.g. at different time intervals), or may be independently controllable, for example.

The different gate control signals 108, 109 may control the gates 106 of the first transistor cell and the gates 107 of the second transistor cell with different gate voltages. For example, the different gate control signals 108, 109 may provide different gate voltages to the gate 106 of the first transistor cell 101 and the gate 107 of the second transistor cell 104 during a (predefined) time interval (e.g. at the same time interval). For example, a first gate control signal 108 generated by a controller module may provide a first gate voltage to the gate 106 of the first transistor cell 101, and a second gate control signal 109 generated by the controller module may provide a second gate voltage to the gate of the second transistor cell during the same time interval (e.g. at the same time). The first gate voltage may be the same or different from the second gate voltage, for example.

Additionally, optionally or alternatively, the different gate control signals 108, 109 provided to the gate 106 of the first transistor cell 101 and the gate 107 of the second transistor cell 104 may switch (e.g. turn on or turn off) the first transistor cell 101 and the second transistor cell 104 at different times (or e.g. at different time interval, for example.

The different gate control signals 108, 109 may be generated by a controller module based on a current of the first transistor cell 101 or on a current of a (first) subset of transistor cells of the plurality of transistor cells 111 comprising the first transistor cell 101. For example, the controller module may be configured to (e.g. may include control logic circuitry to) generate the different control signals 108, 109 based on a current through the first transistor cell 101 or on a current through the (first) subset (e.g. one or two or more transistor cells) of the plurality of transistors cell 111 comprising the first transistor cell 101.

Additionally or optionally, the controller module may be configured to generate the different control signals 108, 109 based on a current through the second transistor cell 104 or on a current through a subset (e.g. one or two or more transistor cells) of the plurality of transistors cell 111 comprising the second transistor cell 104. For example, the controller module may be configured to generate the different control signals 108, 109 based on (or by using) a portion of the load current to control the gate voltages (or gate potentials) of the different control signals 108,109, for example.

The different gate control signals 108, 109 may be generated by the controller module based on a current through an emitter/collector or source/drain contact structure contacting the first transistor cell 101 or the (first) subset of transistor cells of the plurality of transistors cell 111 comprising the first transistor cell 101. The current through the emitter/collector or source/drain contact structure or the temperature of the transistor cell 111 may be determined by a sensing circuit (e.g. a current sensing circuit or a temperature sensing circuit) arranged in proximity to (or e.g. adjacently to) the emitter/collector or source/drain contact structure. For example, the sensing circuit may include a current sensing structure (e.g. a ring electrode structure or a shunt sensing circuit) arranged laterally around a portion of an emitter/collector or source/drain contact structure contacting the first transistor cell to be monitored. For example, the ring electrode structure may be arranged laterally around an electrically conductive (substantially vertical) portion of the emitter/collector or source/rain contact structure. The emitter/collector or source/drain contact structure may include (substantially vertical) electrically conductive pillar structures (e.g. via structures) and/or one or more metallization layers formed on or the first (or front) side surface of the semiconductor chip, for example. The sensing circuit may determine the current through individual subsets of transistor cells by determining a current through individual electrically conductive pillar structures (or e.g. via structures) connected to each subset of transistor cells, for example.

The controller module may be configured to generate the different control signals 108, 109 during turn off (e.g. when the controller module switches off the plurality of transistor cells 111). For example, the controller module may be configured to generate a (global) control signal for turning (or switching) off the plurality of transistor cells 111. If a switching current of a monitored first transistor cell 101 or of a monitored first subset of transistor cells of the plurality of transistor cells 111 exceeds a predefined current density value, the controller module may be configured to generate a first gate control signal 108 for turning on the first transistor cell 101 while the second transistor cell 104 remains turned off. Additionally, or optionally, the controller module may be configured to generate a second gate control signal 109 for turning on the second transistor cell 104. Additionally or optionally, the controller module may be configured to generate the first gate control signal 108 and the second gate control signal 109 for turning on the first transistor cell 101 and the second transistor cell 104 at different time intervals. A controllable switching of different subsets of transistor cells of the plurality of transistor cells 111 may prevent current densities which are too high forming a filament in the semiconductor device 100, for example. In the case of a bipolar switch, active plasma desaturation of every n-th cell (or every n-th sub-unit of transistor cells) may reduce turn-off losses, for example.

The controller module may be configured to generate the different control signals 108, 109 during turn on (e.g. when the controller module switches on the plurality of transistor cells 111). For example, the controller module may be configured to generate a (global) control signal for turning on the plurality of transistor cells 111. If a switching current of a monitored first transistor cell 101 or of a monitored first subset of transistor cells falls below a predefined current density value, the controller module may be configured to generate a first gate control signal 108 for turning off the first transistor cell 101 while the second transistor cell 104 remains turned on. During turn on, the number of active cells may be increased (or decreased) depending on the current density in the monitored one or more first transistor cells 101.

The controller module may include a state machine (or state module) configured to distinguish between different states of the switching process, for example.

The semiconductor device 100 may include a first gate contact structure for connecting at least the gate 106 of the first transistor cell 101 to a first gate driver circuit of the controller module (or circuit) providing the different gate control signals 108, 109, for example. The semiconductor device 100 may further include a second gate contact structure for connecting at least the gate 107 of the second transistor cell to a second gate driver circuit of the controller module (or circuit), for example.

The first gate contact structure and the second gate contact structure may each be or may each include an electrically conductive structure electrically connected respectively to the first gate 106 of the first transistor cell 101 and the second gate 107 of the second transistor cell. For example, the first gate contact structure and the second gate contact structure may each include electrically conductive pillar structures (e.g. via structures) and/or one or more metallization layers formed on (or at) the first (or front) side surface of a semiconductor substrate.

The first gate driver circuit may be configured to provide the first gate voltage to the gate 106 of the first transistor cell 101 (or to gates of a first subset of transistor cells including the first transistor cell 101) based on the first gate control signal generated by the controller module, for example. The second gate driver circuit may be configured to provide the second gate voltage to the gate 107 of the second transistor cell 104 (or to gates of a second subset of transistor cells) based on the (independent or different) second gate control signal generated by the controller module, for example.

The controller module (e.g. the first gate driver circuit, the second gate driver circuit and/or the sensing circuit) may be located in or on the same semiconductor substrate as the transistor cells. For example, the first gate driver circuit, the second gate driver circuit, the sensing circuit and the transistor cells may be part of the same semiconductor chip, for example. For example, the first gate driver circuit and the second gate driver circuit of the controller module may be arranged on the first side surface of the semiconductor substrate (or chip), for example.

The controller module may be located in a semiconductor layer between a lateral side (e.g. a first or front side surface) of the semiconductor chip (or substrate) comprising the plurality of transistor cells 111 and a metallization layer arranged on the lateral side (e.g. first or front side surface) of the semiconductor chip. For example, the first gate driver circuit and the second gate driver circuit may be arranged between the gates of the transistor cells and metallization layer stacks located on the first side surface of the semiconductor substrate. For example, the first gate driver circuit and the second gate driver circuit may be arranged between the gates of the transistor cells and a portion of an emitter/collector or source/drain contact structure contacting the transistor cells of the vertical FET arrangement. The portion of the emitter/collector or source/drain contact structure may be or may include one or more metallization layers in electrical connection with emitter/collector or source/drain doping regions of the transistor cells, for example. Alternatively or optionally, the controller module may be located in the semiconductor chip (421) (e.g. the controller module may form part of the bulk substrate of the semiconductor chip).

Alternatively or optionally, the controller module may be located in an electrically insulated (or isolated) area of the semiconductor chip. For example, an isolation area may be formed by etching and oxidizing or depositing an insulation material in or around the isolation area. Furthermore, silicon deposition or deposition in a silicon-based recess may be carried out to form the controller module in the isolation area, for example.

Alternatively or optionally, the controller module (e.g. the first gate driver circuit, the second gate driver circuit and/or the sensing circuit) may be located in (or on) a different (e.g. a second) semiconductor chip as the transistor cells, for example. For example, the first gate driver circuit, the second gate driver circuit and the sensing circuit may be located in a different semiconductor chip from the transistor cells, for example. The second semiconductor chip may be connected to the (first) semiconductor chip in which the transistor cells are located, via at least one (or e.g. one or more) flip-chip connection structures, for example. The at least one flip-chip connection structure may include a solder bump comprising solder material for providing a solder connection between the first semiconductor substrate and the second semiconductor chip comprising the controller module, for example. Alternatively or optionally, the at least one flip-chip connection structure may include a gold stat or other type of flip-chip connection materials or methods). Optionally, a flip-chip connection structure may be part of a gate contact structure electrically connected to the gates of the transistor cells, for example. Additionally or optionally, a flip-chip connection structure may be part of an emitter/collector or source/drain contact structure electrically connected to the emitter/collector or source/drain doping regions of the transistor cells, for example.

Each further semiconductor chip (e.g. the second semiconductor chip) may include an electrically conductive via structure. The electrically conductive via structure may extend from a first side surface of the second semiconductor substrate (of the second semiconductor chip) towards (or to) a second side surface of the second semiconductor substrate (of the second semiconductor chip), for example.

The electrically conductive via structure may be connected to the first semiconductor chip via a (first) flip-chip connection structure located at the first side surface of the second semiconductor chip, for example. The electrically conductive via structure may be electrically connected to an emitter/collector or source/drain doping region of the first transistor cell in the first semiconductor chip, for example.

The electrically conductive via structure may be part of an emitter/collector or source/drain contact structure located or arranged in the second semiconductor chip. The emitter/collector or source/drain contact structure may further include a metallization layer portion arranged on a second side surface of the second semiconductor chip, for example. The metallization layer portion may be in electrical connection with the electrically conductive via structure, for example. The metallization layer portion may include one or more metal layers located on the second side surface of the second semiconductor chip, for example.

The first gate driver circuit of the controller module located in the second semiconductor chip may be connected to a gate of the first transistor cell through a further (second) flip-chip connection structure. The first gate driver circuit may be located at the first side of the second semiconductor substrate. The first gate driver circuit of the controller module may be flip-chip bonded (or soldered) to the gate 106 of the first transistor cell 101 or to a gate contact structure contacting the gate of the first transistor cell 101, for example.

The second gate driver circuit located at the first side of the second semiconductor substrate may be flip-chip bonded (or soldered) to the gate 107 of the second transistor cell 104 or to a gate contact structure contacting the gate of the second transistor cell 104, for example.

The controller module may be configured to generate a first gate control signal for controlling a gate of the first transistor cell based on a sensor signal provided by a sensor circuit. The sensor circuit may be or may include a current sensor circuit. The sensor signal may include information related to a current (e.g. a switching current) measured in the electrically conductive via structure, for example. The current may be measured by the current sensing circuit located in (or on) the second semiconductor chip, for example. The current sensing circuit may include a current sensing structure (e.g. a ring electrode structure or a shunt) arranged in proximity (e.g. closer than 100 µm, closer than 50 µm, closer than 20 µm or closer than 10 µm) to (or laterally around) the electrically conductive via structure, for example. For example, the current sensing circuit may be located at the first side surface of the second semiconductor chip. Alternatively, the sensor circuit may be or may include a temperature sensing circuit (e.g. a temperature diode or a PTC (positive temperature coefficient) element. The temperature sensing circuit may be used to determine or to derive a current in the electrically conductive via structure, for example.

The current sensing structure (e.g. a ring electrode structure or a shunt) may be arranged closer than 100 µm (or closer than 50 µm, closer than 20 µm or closer than 10 µm) to an emitter/collector or a source/drain contact structure (e.g. an electrically conductive via structure of the emitter/collector or the source/drain contact structure) conducting the current or current signal to be determined.

For example, the current through an emitter/collector or a source/drain contact structure to a single transistor cell of the plurality of transistor cells or a subset of transistor cells of the plurality of transistor cells may be determined by a sensing circuit comprising a current sensing structure arranged on the same semiconductor die as the plurality of the plurality of transistor cells of a vertical field effect transistor arrangement. The current sensing structure may be arranged in proximity (e.g. closer than 100 µm, closer than 50 µm, closer than 20 µm or closer than 10 µm) to an electrically conductive via structure of the emitter/collector or source/drain contact structure. For example, the current sensing structure may be arranged in proximity to an electrically conductive via structure conducting the current of a single transistor cell or conducting the current of a subset of transistor cells of the plurality of transistor cells, but not a current of all or a current flowing to or coming from all transistor cells of the plurality of transistor cells.

The current sensing structure may be a ring electrode electrically insulated from the electrically conductive via structure and laterally surrounding the electrically conductive via structure conducting the current to be determined or may be a shunt structure (e.g. shunt resistor structure) with a high-ohmic contact to the electrically conductive via structure for tapping a potential at the electrically conductive via structure, for example.

The number of gate driver circuits of the vertical FET arrangement may be equal to the number of transistor cells of the vertical FET arrangement, for example. For example, each transistor cell may be individually controlled by its own gate driver circuit, for example. Alternatively or optionally, a first gate driver circuit may provide a (first) gate control signal for controlling a first subset of the plurality of transistor cells and a second gate driver circuit may provide a (second or different) gate control signal for controlling a second plurality of transistor cells.

The sensing circuit may include a number of sensing structures. The number of sensing structures of the vertical FET arrangement may be equal to the number of transistor cells of the vertical FET arrangement, for example. For example, the current passing through each transistor cell may be individually monitored by a sensing structure. Alternatively or optionally, a current passing through one or more transistor cells of a first subset of the plurality of transistor cells may be monitored by a first sensing structure of the sensing circuit and a current passing through one or more transistor cells of a second subset of the plurality of transistor cells may be monitored by a second sensing structure of the sensing circuit.

Each transistor cell of the vertical FET arrangement may be a vertical transistor cell, for example. A vertical transistor cell may be a transistor cell (or transistor structure) wherein a largest current of the transistor cell flows in a vertical direction (e.g. in a direction substantially perpendicular to a main lateral side or surface of the semiconductor substrate, for example. For example, the largest current of the transistor cell may flow in a vertical direction between a device doping region located at a first (or front) side surface of the semiconductor substrate and a device doping region located at an opposite second (or back) side surface of the semiconductor substrate.

Each transistor cell of the vertical FET arrangement may be a vertical metal oxide semiconductor field effect transistor (MOSFET) structure, a vertical insulated gate bipolar transistor (IGBT) structure or a vertical thyristor structure, for example. For example, each transistor cell may be an RC-IGBT structure, a superjunction MOSFET structure, or a superjunction IGBT structure.

For a vertical FET arrangement comprising vertical MOSFET transistor cells, a first source/drain doping region and a gate of a MOSFET transistor cell (or structure) may be located at a first (or front) side lateral surface of the semiconductor substrate. A second source/drain doping region of the MOSFET transistor cell may be located at a second (or back) side lateral surface of the semiconductor substrate.

For a vertical FET arrangement comprising vertical IGBT transistor cells, a first collector/emitter doping region and a gate of an IGBT transistor cell may be located at the first (or front) side lateral surface of the semiconductor substrate. A second collector/emitter doping region of the IGBT transistor cell may be located at the second (or back) side lateral surface of the semiconductor substrate.

The plurality of transistor cells 111 of the vertical FET arrangement may include more than twenty transistor cells, or more than 100 transistor cells or more than 1000 transistor cells, for example.

The first transistor cell 101 may be part of a first subset of transistor cells of the plurality of transistors cells 111, for example. The first subset of transistor cells may refer to a first group of one or more transistor cells of the plurality of transistor cells 111, for example. The first subset of transistor cells may be controllable by a first gate control signal, for example. For example, all the transistor cells in the first subset of transistor cells may be commonly controllable by the same (first) gate control signal.

The second transistor cell 104 may be part of a second (different) subset of transistor cells of the plurality of transistors cells 111, for example. The second subset of transistor cells may refer to a second group of one or more transistor cells of the plurality of transistor cells 111, for example. The transistor cells in the second subset of transistor cells may be different from the transistor cells in the first subset of transistor cells, for example. The second subset of transistor cells may be controllable by a second gate control signal, for example. For example, all the transistor cells in the second subset of transistor cells may be commonly controllable by the same (second) gate control signal.

The plurality of transistor cells 111 of the vertical FET arrangement may include the first subset of transistor cells, the second subset of transistor cells and additionally or optionally, one or more further subsets (e.g. more than two subsets, or more than five subsets, or more than hundreds of subsets) of transistor cells. A subset of the plurality of transistor cells (or total number of transistor cells may be understood to refer to a number of transistor cells less than the total number of transistor cells (e.g. a fraction of the total number of transistor cells, the fraction being less than 1). Each subset of transistor cells of the total number of transistor cells of the vertical FET arrangement may include less than 50% (or e.g. less than 20% or e.g. less than 10%, or e.g. less than 5%) of the total number of transistor cells of the vertical FET arrangement. For example, the first subset (or second subset) of transistor cells may include between 20% and 50% of a total number of the plurality of transistor cells of the vertical FET arrangement. The subsets of transistor cells may be controlled by different gate control signals. It may be possible to provide one or more (e.g. several) subsets of transistor cells of the total number of transistor cells with identical (or different) gate control signals, for example. For example, it may be possible to control a single transistor cell (or a selected one or more transistor cells) of the total number of transistor cells of the vertical FET arrangement with identical gate control signals.

The first subset of transistor cells and the second subset of transistor cells may each include at least one (or e.g. one) transistor cell. The first subset of transistor cells and the second subset of transistor cells may each include more than ten (or e.g. more than five) transistor cells, for example. For example, the number of transistor cells in the first subset of transistor cells may be more than ten (or e.g. more than five). For example, the number of transistor cells in the first subset of transistor cells may be more than ten (or e.g. more than five). For example, the plurality of transistors 111 of the vertical FET arrangement may include more than five subsets of less than five transistor cells, or more than ten subsets of less than five transistor cells.

The first subset of transistor cells (including the first transistor cell 101) may be arranged in a first region of a semiconductor substrate. For example, the first subset of transistor cells may include four transistor cells arranged in a 2×2 array in the first region of the semiconductor substrate.

A second subset of transistor cells (including the second transistor cell) may be arranged in a second different region of the semiconductor substrate.

The first region of the semiconductor substrate may include (or may occupy) a (first) lateral semiconductor substrate area of less than 30 μm×30 μm cm$^2$. The lateral semiconductor substrate area of the first region of the semiconductor substrate may include (or may be) a lateral surface area of a lateral side surface of the semiconductor substrate. The first region may include the (first) lateral semiconductor substrate area and portions of the semiconductor substrate located below the (first) semiconductor substrate area, for example.

The second region of the semiconductor substrate may be arranged laterally around the first region of the semiconductor substrate. For example, the second region of the semiconductor substrate may include a lateral semiconductor substrate area laterally surrounding the first region of the semiconductor substrate.

The first subset of transistor cells (including the first transistor cell 101) and the second subset of transistor cells (including the second transistor cell 104) may be electrically connected in parallel. For example, transistor cells of the first subset of transistor cells and transistor cells of the second subset of transistor cells may be electrically connected in parallel. For example, the first emitter/collector or source/drain doping regions of the first subset of transistor cells may be electrically connected to the first emitter/collector or source/drain doping regions of the second subset transistor cells via at least one electrically conductive (e.g. metallization layer) structure. The first emitter/collector or source/drain doping regions of the first subset of transistor cells 101 and the first emitter/collector or source/drain doping regions of the second subset transistor cells may be located at a first (e.g. a front) side surface of the semiconductor chip (or substrate). Additionally, the second emitter/collector or source/drain doping regions of the first subset of transistor cells 101 may be electrically connected to the second emitter/collector or source/drain doping regions of the second subset transistor cells via at least one electrically conductive (e.g. metallization layer) structure. The second emitter/collector or source/drain doping regions of the first subset of transistor cells and the second emitter/collector or source/drain doping regions of the second subset transistor cells may be located at a second (e.g. a back) side surface of the semiconductor chip (or substrate), for example.

The front (or e.g. a first) side surface of the semiconductor substrate may be a surface of the semiconductor substrate towards metal layers, insulation layers and/or passivation layers on top of the main surface of the semiconductor substrate or on a surface of one of these layers. For example, the front side surface of the semiconductor substrate may be a lateral surface of the semiconductor substrate at which more (or a majority of) active elements of the semiconductor device structures are formed. For example, more complex structures may be located at the front side surface of the semiconductor substrate than at an opposite facing back side surface of the semiconductor substrate.

The back (or e.g. a second) side surface of the semiconductor substrate may be a surface at which a back side metallization structure is arranged. The back side metallization structure may be a single continuous metallization structure arranged on (e.g. directly on) the back side surface, for example. The back side metallization structure may cover the whole of the back side surface of the semiconductor substrate or more than 80% of the back side surface of the semiconductor substrate, for example.

A (front or back) lateral side surface of the semiconductor substrate may be a substantially even plane (e.g. neglecting unevenness of the semiconductor substrate due to the manufacturing process and trenches). In comparison to a basically vertical edge of the semiconductor substrate, the front side surface and the back side surface may each be a basically horizontal surface extending laterally. For example, a lateral dimension (e.g. a diameter or a length) of the (front or back) side surface of the semiconductor substrate may be more than 100 times larger (or more than 1000 times or more than 10000 times) than a distance between the front side surface 105 of the semiconductor substrate and the opposite back side surface of the semiconductor substrate. For example, a lateral dimension (e.g. a diameter) of the main surface of the semiconductor substrate may be more than 100 times larger (or more than 1000 times or more than 10000 times) than a maximal height of structures on the main (or front) surface.

The semiconductor substrate may have a maximal thickness of between 10 µm and 1500 µm (or e.g. between 20 µm and 700 µm or e.g. between 50 µm and 350 µm or e.g. between 50 µm and 150 µm), for example. The maximal thickness of the semiconductor substrate may be a largest height of the semiconductor substrate measured in a direction between the front side surface and back side surface of the semiconductor substrate.

The semiconductor substrate may include a semiconductor substrate material (e.g. a semiconductor substrate wafer), for example. For example, the semiconductor substrate material may be a silicon-based semiconductor substrate material, a silicon carbide-based semiconductor substrate material, a gallium arsenide-based semiconductor substrate material or a gallium nitride-based semiconductor substrate material.

The semiconductor device 100 may be a power semiconductor device. In other words, a semiconductor device according to the described concept or one or more embodiments described above or below may have a blocking voltage of more than 10 V (e.g. between 10 V and 20000 V, or e.g. more than 40 V or e.g. more than 200 V, or e.g. more than 400 V, or e.g. more than 1000 V), for example.

Transistor (semiconductor) devices (e.g. MOSFET and/or IGBT devices) may be optimized for certain typical operating conditions. The power class of such a power switch may be tailored to accommodate maximum expected load currents. The actual operating conditions may vary vastly. Therefore, for a large fraction of its lifetime, the switch may deliver reduced performance. If the active chip area of an IGBT is dynamically adapted to the switching current, the trade-off may improve greatly. Reverse bias safe operating area (RBSOA) destruction of IGBTs may be related to inhomogeneous current flow.

Multiple gate controls may divide the chip area into smaller portions which may be separately controlled depending on the switching conditions. Granularity may be coarse and the control logic may be programmed prior to the actual current pulse to modify the active area of the chip, for example. Dynamically balancing the current distribution may rely on local on-chip potential or capacitive or inductive couplings. However, these techniques may trade off performance against robustness.

The examples described herein may include a gate driver scheme with high (or higher) granularity. For example, the gate of every transistor (IGBT) cell may be controlled individually and the current of the corresponding cell may also be monitored on a single-cell level. Alternatively or optionally the gates of a subset of transistor cells may be controlled based on a monitored current through a single cell or through a subset of transistor cells, for example.

In an example, a flip-chip-technique may be used with an appropriate fine pitch. The interconnection (e.g. the flip-chip connection) may be realized by using bump bonds, for example. Each transistor (IGBT) cell may have (or need) two flip-chip connections: one for the emitter and one for the gate contact, for example. The gate driver chip may let the load current pass to its backside, e.g. by using through-silicon-vias. A fraction (or a portion) of the load current (current monitor) may be used to control the gate potential supplied by the gate driver, for example.

A state machine may be implemented in the semiconductor device 100 to distinguish between different states of the switching process, for example. For example, during turn-on, the number of active cells may be increased depending on the current level. If only a small current is switched, the active area may be smaller and turn-off losses may be reduced, for example. In the case of short-circuits, the failure may be detected easily and fast by the current monitor and a fast response is possible. For example, during turn-off, the currents may be monitored and compared and if a certain current density is exceeded, the corresponding transistor (IGBT) cell may be turned on. In addition, one or more neighboring cells may also be turned on to prevent too high current densities in a filament, for example.

The examples described may ensure soft turn-off by turning-off individual areas of the IGBT in a well-defined temporal (e.g. by turning off transistor cells located in different doping regions of the semiconductor substrate at different defined time intervals). For example, each (e.g. every) transistor cell contact may be controlled individually from other transistor cells. Alternatively, several (or e.g. a plurality of) cells may be controlled together as a sub-unit (or subset) simultaneously. Different sub-units (or subsets) of transistor cells may be consecutively turned off, for example. In this way, efficient active area may be reduced dynamically during the turn-off period and over-voltage may be reduced significantly, for example. To reduce turn-off losses, active plasma desaturation of every n-th cell (or every n-th sub-unit of transistor cells) may be possible, for example.

A failure memory may be implemented in the controller module 213 of the semiconductor device 100 for easy traceability of error conditions. Using a highly granular gate driver scheme in conjunction with granular current measurements may enable load specific performance optimization and overload detection with a very low intervention threshold, for example.

Figure 2:
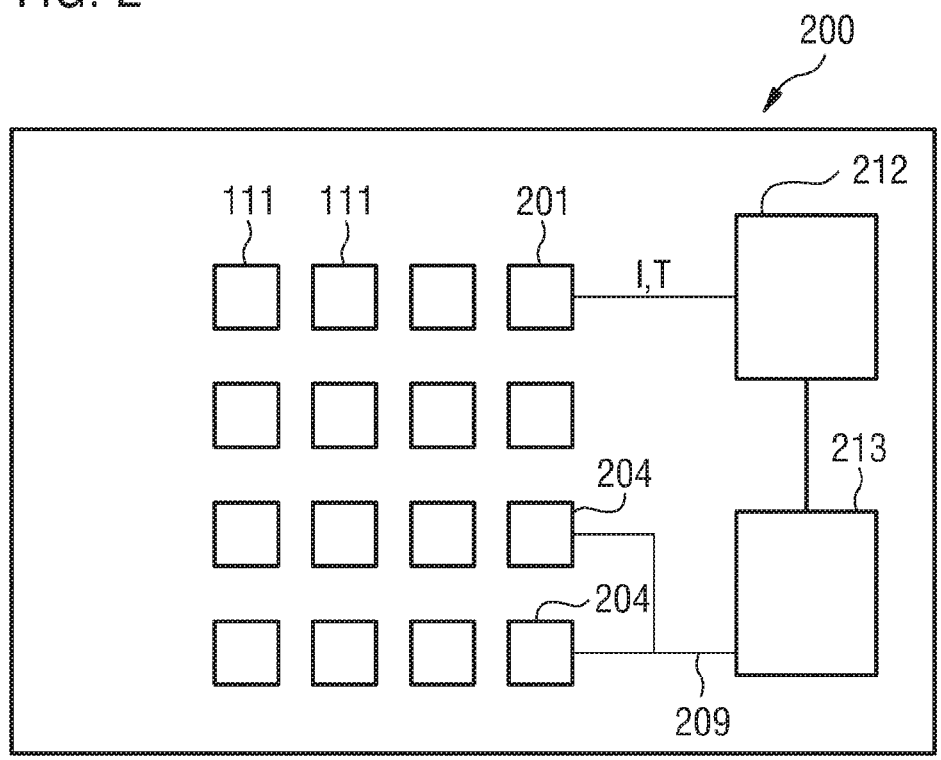
FIG. 2 shows a schematic illustration of a further semiconductor device including a current sensing circuit.

FIG. 2 shows a schematic illustration of a further semiconductor device 200 according to an embodiment.

The semiconductor device 200 comprises a plurality of transistor cells 111.

The semiconductor device 200 further comprises a sensing circuit 212 configured to determine a current, I, or a temperature, T, through at least one transistor cell 201 of the plurality of transistor cells 111.

The semiconductor device 200 further comprises a controller module 213 configured to generate a gate control signal 209 for controlling a subset of the plurality of transistor cells 111 based on the determined current, I, through the at least one transistor cell 201.

Due to the controller module 213 being configured to generate a gate control signal for controlling a subset 204 of the plurality of transistor cells 111 based on the determined current through the at least one transistor cell 201, switching losses (e.g. due to over-voltage) may be reduced, for example. For example, the transistor cells may be dynamically adapted to the different load currents, for example.

The sensing circuit 212 (e.g. a current monitor) may be configured to determine a current through the at least one transistor cell 201 (or e.g. one or more transistor cells). The sensing circuit 212 may be configured to determine the current through a emitter/collector or source/drain contact structure contacting at least one transistor cell 201 to be monitored. For example, the sensing circuit 212 may be arranged adjacently or in proximity to the emitter/collector or source/drain contact structure of the at least one transistor cell 201 to be monitored.

The sensing circuit 212 may include a current sensing structure (e.g. a ring electrode structure or shunt sensing structure) arranged in proximity to (or laterally around) a portion of the emitter/collector or source/drain contact structure contacting the at least one transistor cell 201 to be monitored. For example, the sensing circuit 212 may include a ring electrode structure arranged laterally around a substantially vertical electrically conductive via (or pillar) portion of the emitter/collector or source/drain contact structure.

Alternatively, additionally or optionally, the sensing circuit 212 may include a temperature sensing structure (e.g. a temperature diode structure or a circuit comprising a positive temperature coefficient element) configured to determine the temperature through the at least one transistor cell 201.

The controller module 213 may be configured to generate the gate control signal 209 for controlling a subset 204 of the plurality of transistor cells 111. The subset of the plurality of transistor cells 111 may be a subset of transistor cells including the monitored at least one transistor cell 201 or may be a subset of transistor cells without the monitored at least one transistor cell 201, for example.

The plurality of transistor cells 111 may include lateral (or planar) transistor cells (e.g. planar IGBT or planar MOSFET transistor cells), or vertical transistor cells or trench transistor cells, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1) or below (e.g. FIGS. 3 to 7).

Figure 3:
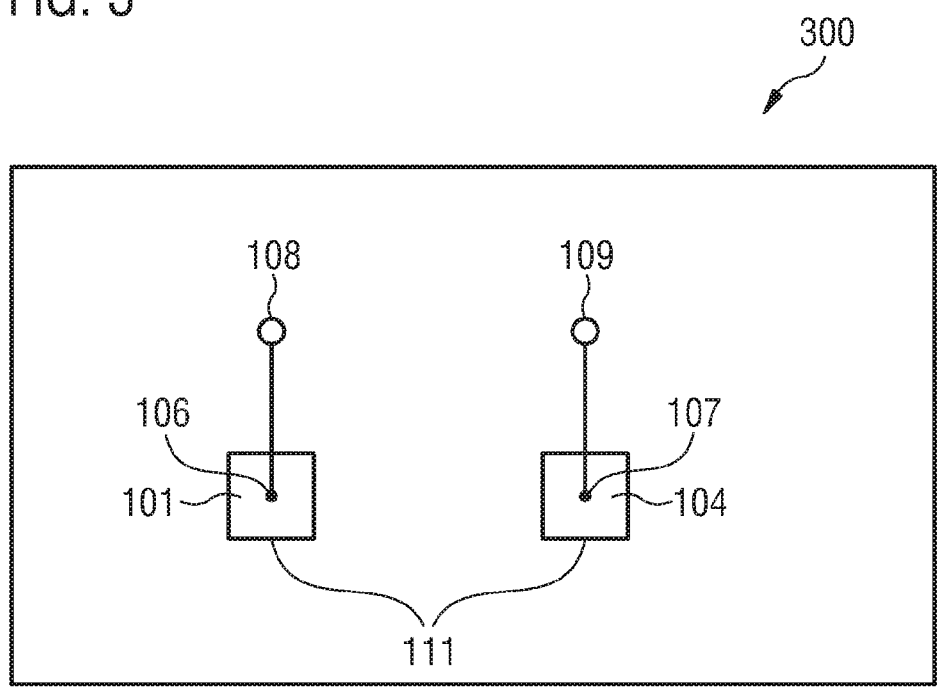
FIG. 3 shows a schematic illustration of a further semiconductor device including a plurality of transistor cells.

FIG. 3 shows a schematic illustration of a further semiconductor device 300 according to an embodiment.

The semiconductor device 300 comprises a plurality of transistor cells 111 of a vertical field effect transistor arrangement.

A gate 106 of a first transistor cell 101 of the plurality of transistor cells 111 and a gate 107 of a second transistor cell 104 of the plurality of transistor cells 111 are controllable by different gate control signals 108, 109.

A blocking voltage of the vertical field effect transistor arrangement is at least 10 V.

Due to the gate 106 of the first transistor cell 101 and the gate 107 of the second transistor cell 104 being controllable by different gate control signals 108, 109, switching losses (e.g. due to over-voltage) in transistor cells (e.g. power transistor cells) may be reduced, for example. For example, the transistor cells may be dynamically adapted to the different load currents.

The semiconductor device 300 may be similar to the semiconductor devices described in connection with FIGS. 1 and 2.

The plurality of transistor cells may be power transistor cells, for example. For example, the vertical field effect transistor arrangement or the semiconductor device 300 may have a blocking voltage of more than 10 V (e.g. between 10 V and 20000 V, or e.g. more than 40 V or e.g. more than 200 V, or e.g. more than 400 V, or e.g. more than 1000 V), for example.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1 to 2) or below (e.g. FIGS. 4 to 7).

Figure 4:
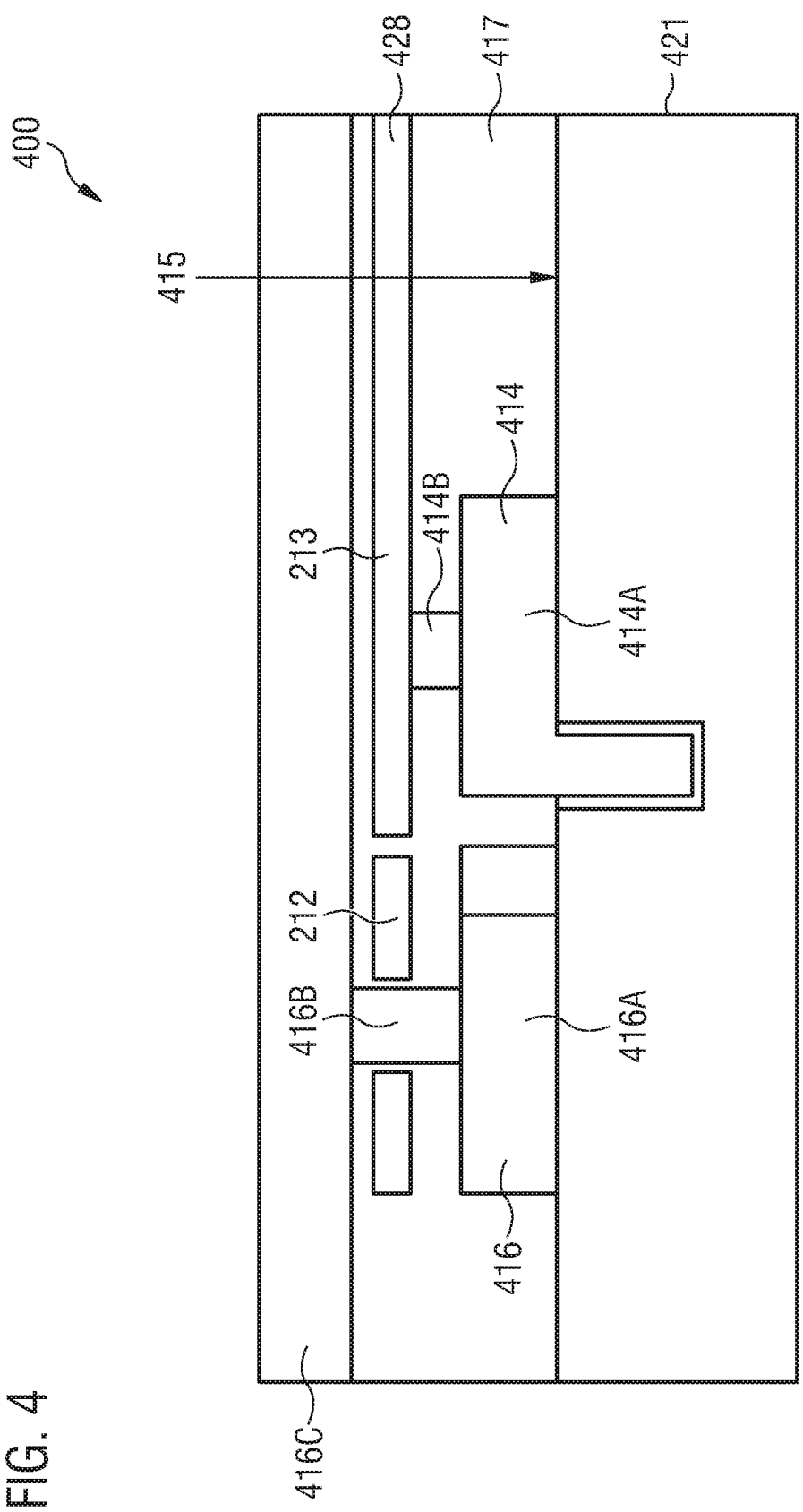
FIG. 4 shows a schematic illustration of a further semiconductor device including a controller module and at least one transistor cell.

FIG. 4 shows a schematic illustration of a further semiconductor device 400 according to an embodiment.

The semiconductor device 400 may include a first transistor cell, a controller module 213 and a sensing circuit 212 located in (or on) the same semiconductor chip. The first transistor cell may be part of a first subset of transistor cells of a plurality of transistor cells formed or located in the semiconductor chip.

The controller module 213 (e.g. the first gate driver circuit and/or further gate driver circuits), the sensing circuit 212 and the plurality of transistor cells 111 may be part of the same semiconductor chip 421. For example, the first gate driver circuit, the sensing circuit and the first transistor cell may be located or arranged in (or on) the same semiconductor chip, for example. The controller module 213 and the sensing circuit 212 may be manufacturable (or formed) in a semiconductor layer 428 located on the semiconductor device 400.

The semiconductor layer 428 may be located between a lateral side 415 (e.g. a first or front side surface) of the semiconductor chip 421 (or substrate) comprising the first transistor cell and a metallization layer 416C (e.g. a metallization layer of an emitter/collector or source/drain contact structure 416) arranged on the lateral side 415 (e.g. first or front side surface) of the semiconductor chip. Alternatively or optionally, the semiconductor layer 428 may be part of the bulk substrate of the semiconductor chip. For example, the first gate driver circuit of the controller module 213 (and/or the controller module 213) may be located in the semiconductor layer 428 (e.g. a gate driver layer or region). For example, the semiconductor device 400 may include the gate driver circuit (e.g. the controller module 213) and current monitor (e.g. the sensing circuit 212) functionality on (or in) a (separate) silicon layer which may be located on top of an IGBT chip 421 and isolated by the isolation layer 417, for example.

The semiconductor device 400 may include the controller module 213 configured to generate a gate control signal for controlling a gate of at least one transistor cell of a plurality of transistor cells located in the semiconductor substrate, for example. The semiconductor device 400 may include a first gate contact structure 414 for connecting at least the gate of the first transistor cell to a first gate driver circuit of the controller module 213 (or circuit), for example.

The first gate contact structure 414 may be or may include an electrically conductive structure electrically connected respectively to a gate (e.g. including a gate metal layer and a gate oxide layer) of the first transistor cell. For example, the first gate contact structure 414 may include an electrode layer 414A (e.g. gate electrode) arranged adjacently (e.g. directly adjacently) to a gate region of the first transistor cell. The first gate contact structure 416 may further include an electrically conductive via structure 414B and/or one or more metallization layers formed on or the first (or front) side surface of the semiconductor substrate, for example.

The semiconductor device 400 may further include a sensing circuit 212 (e.g. a current monitor) configured to determine a current through the first transistor cell. The sensing circuit 212 may be configured to determine the current through an emitter/collector or source/drain contact structure 416 (or a portion of the emitter/collector or source/drain contact structure 416) contacting the first transistor cell. For example, the sensing circuit 212 may be arranged adjacently or in proximity to the emitter/collector or source/drain contact structure 416. The sensing circuit may directly use all or a portion of the current flow via 416B for determining the current through the first transistor cell, for example.

The sensing circuit 212 may include a sensing structure (e.g. a ring electrode structure or a shunt) arranged laterally around a portion of the emitter/collector or source/drain contact structure 416 contacting the first transistor cell. For example, the sensing circuit 212 may include a ring electrode structure arranged laterally around the substantially vertical electrically conductive via structure 416B of the emitter/collector or source/drain contact structure 416.

The emitter/collector or source/drain contact structure 416 may include an electrode layer 416A (e.g. emitter electrode) arranged adjacently (e.g. directly adjacently) to an emitter/collector or source/drain doping region of the first transistor cell, for example. The emitter/collector or source/drain contact structure 416 may further include the electrically conductive via structure 416B and/or the one or more metallization layers 416C (e.g. emitter metal) formed on or the first (or front) side surface of the semiconductor substrate, for example. For example, the one or more metallization layers 416C (e.g. emitter metal) may be located on electrically insulating material 417 covering (or embedding) the current sensor circuit 212 and the controller module 213 (e.g. the gate driver circuit), for example.

The semiconductor device 400 may further include the electrically insulating material 417 (e.g. one or more isolation layers) arranged on the first side surface 415 of the semiconductor chip 421 (or substrate). For example, a portion of the electrically insulating material 417 may be located between the gate contact structure 414 and the first gate driver circuit of the controller module 213, for example. For example, a portion of the electrically insulating material 417 may be located adjacent to (or may laterally surround) the gate contact structure 414. For example, a portion of the electrically insulating material 417 may be located between the gate contact structure 414 and the emitter/collector or source/drain contact structure 416. For example, a portion of the electrically insulating material 417 may be located adjacent to (or may laterally surround) the emitter/collector or source/drain contact structure 416. For example, a portion of the electrically insulating material 417 may be located adjacent to (or may laterally surround) the sensing circuit 212.

The controller module 213 may be configured to generate a first gate control signal for controlling a gate of the first transistor cell 101 (or gates of the first subset of transistor cells comprising the first transistor cell 101) based on a measured current through the first transistor cell 101. Additionally or optionally, the controller module may be configured to generate a second different gate control signal for controlling a gate of a second transistor cell (or gates of a second subset of transistor cells comprising the second transistor cell) based on the current determined in the first transistor cell 101.

The sensing circuit 212 may include a plurality of sensing structures. Each sensing structure of the sensing circuit 212 may be configured to determine a current through a transistor cell (or a subset of transistor cells) of the plurality of transistor cells, for example. The controller module 213 may be configured to generate the first gate control signal and the different second gate control signal based on the currents determined by the plurality of sensing structures, for example.

The plurality of transistor cells 111 may include lateral (or planar) transistor cells, or vertical transistor cells or trench transistor cells, for example. For example, each transistor cell of the may be a metal oxide semiconductor field effect transistor (MOSFET) structure, an insulated gate bipolar transistor (IGBT) structure or a thyristor structure, for example.

In the case of the plurality of transistor cells 111 being lateral (or planar) transistor cells (e.g. if the first emitter/collector or source/drain region and the second emitter/collector or source/drain region are formed at the same lateral side surface of the semiconductor substrate), the first emitter/collector or source/drain regions may be connected to a first metallization layer via a plurality of first electrically conductive pillar (or via) structures, and the second emitter/collector or source/drain regions may be connected to a second (different) metallization layer via a plurality of second electrically conductive pillar (or via) structures, for example.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1 to 3) or below (e.g. FIGS. 5 to 7).

Figure 5:
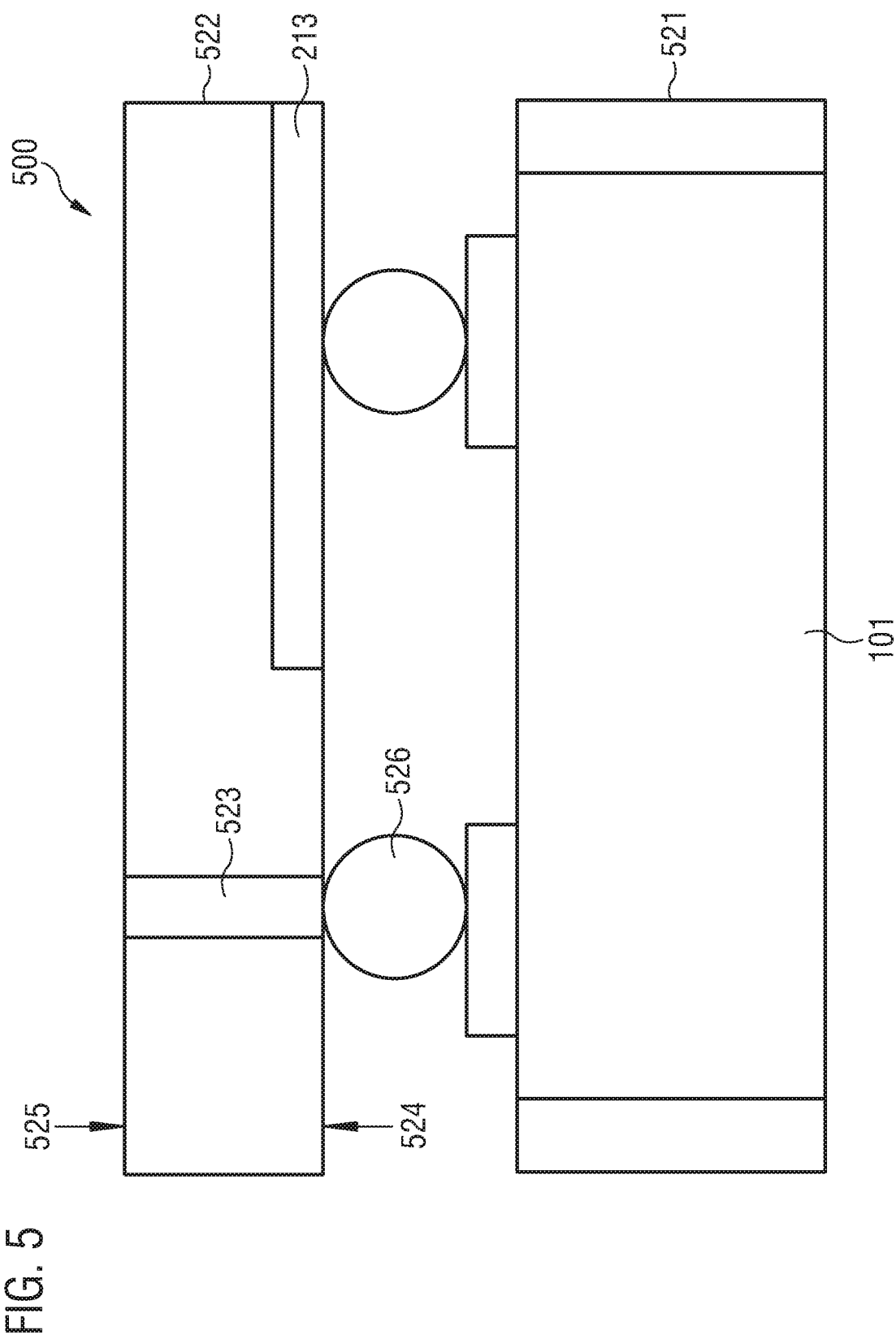
FIG. 5 shows a schematic illustration of a further semiconductor device including a flip-chip connection structure.

FIG. 5 shows a schematic illustration of a further semiconductor device 500 according to an embodiment.

The semiconductor device 500 comprises a first semiconductor chip 521 comprising at least one transistor cell 101.

The semiconductor device 500 further comprises a second semiconductor chip 522 comprising a controller module 213 for controlling a gate of the at least one transistor cell 101.

The second semiconductor chip 522 comprises an electrically conductive via structure 523 extending between a first side surface 524 of a semiconductor substrate of the second semiconductor chip 522 towards a second side surface 525 of the semiconductor substrate of the second semiconductor chip 522.

The electrically conductive via structure 523 is connected to the at least one transistor cell 101 of the first semiconductor chip 521 through a flip-chip connection structure 526.

Due to the electrically conductive via structure 523 being connected to the at least one transistor cell 101 of the first semiconductor chip 521, a controller module 213 located in the second semiconductor chip 522 may measure an electrical characteristic of the at least one transistor cell 101 easily.

The first semiconductor chip 521 (e.g. an IGBT or MOSFET chip) may be or may include a first semiconductor substrate, for example. The first semiconductor chip 521 may include the at least one transistor cell 101 (or e.g. a plurality of transistor cells of a vertical FET arrangement) formed at least partially in or on the first semiconductor substrate, for example.

The second semiconductor chip 522 may be or may include a second semiconductor substrate, for example. The second semiconductor chip 522 may include at least one gate driver circuit of the controller module 213 for controlling the gate of the at least one transistor cell 101. The controller module 213 may be formed at least partially in or on the second semiconductor substrate, for example.

The electrically conductive via structure 523 may be or may include a through-silicon via, for example. For example, the electrically conductive via structure 523 may extend (substantially vertically) from the first side surface 524 of the second semiconductor chip 522 to a second side surface 525 of the second semiconductor chip 522.

The electrically conductive via structure 523 may be part of an emitter/collector or source/drain contact structure contacting an emitter/collector or source/drain doping region of the at least one transistor cell 101. For example, the electrically conductive via structure 523 may be electrically connected to the emitter/collector or source/drain doping region of the at least one transistor cell through the flip-chip connection structure 526.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1 to 4) or below (e.g. FIGS. 6 to 7).

Figure 6A:
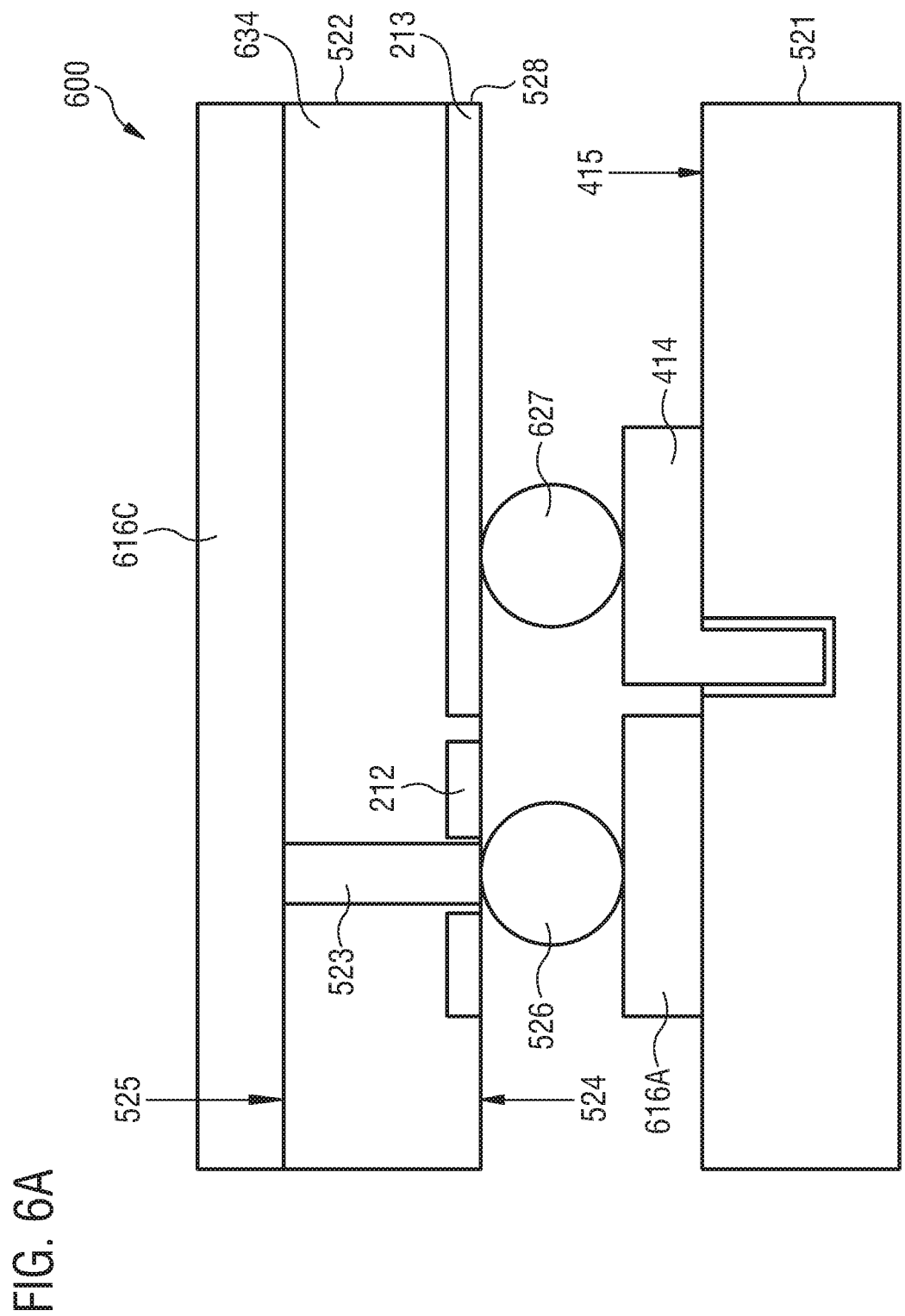
FIG. 6A shows a schematic illustration of a further semiconductor device including two semiconductor chips.

FIG. 6A shows a schematic illustration of a further semiconductor device 600 according to an embodiment.

The semiconductor device 600 may be similar to the semiconductor device described in connection with FIGS. 1 to 5, for example.

A portion of the electrically conductive via structure 523 exposed at the first side surface 524 of the second semiconductor chip 522 (e.g. a gate driver chip) may be electrically connected to an electrode layer portion 616A of an emitter/collector or source/drain contact structure via the (first) flip-chip connection structure 526, for example. The electrode layer portion 616A (e.g. emitter under bump metal) of the emitter/collector or source/drain contact structure may be located at or on a first (or front) side surface 415 of the semiconductor substrate of the first semiconductor chip 521, for example. A second portion of the electrically conductive via structure 523 exposed at the second side surface 525 of the semiconductor substrate of the second semiconductor chip 522 may be electrically connected to one or more metallization layers 616C (e.g. emitter metal) formed on the second side surface 525 of the semiconductor substrate of the second semiconductor chip 522, for example. For example, the electrically conductive via structure 523 and the one or more metallization layers 616C may be part of the emitter/collector or source/drain contact structure.

The second semiconductor chip 522 may include the sensing circuit 212. The sensing circuit 212 may include a sensing structure (e.g. a ring electrode structure) arranged laterally around a portion of an emitter/collector or source/drain contact structure contacting at least the at least one transistor cell, for example. For example, the ring electrode structure may be arranged laterally around the electrically conductive via structure 523. For example, the sensing circuit 212 may be located at the first side surface 524 of the semiconductor substrate of the second semiconductor chip 522.

The controller module 213 may be configured to generate a gate control signal for controlling a gate of the at least one transistor cell based on a current measured (by the sensing circuit) in the electrically conductive via structure 523, for example.

The controller module 213 may be (electrically) connected to the gate of the at least one transistor cell 101 through a further flip-chip connection structure 627, for example.

The controller module 213 may be (electrically) connected to the gate (or a gate contact structure 414) of the at least one transistor cell 101 through (or via) a further (second) flip-chip connection structure 627, for example. For example, the controller module 213 may be electrically connected to the gate of the at least one transistor cell 101 located in the first semiconductor chip 521 via the further flip-chip connection structure 627. For example, the controller module 213 may be electrically connected to the gate contact structure 414 electrically connected to the gate of the at least one transistor cell 101 located in the first semiconductor chip 521 via the further flip-chip connection structure 627. The controller module 213 may be configured to generate or provide a gate control signal for controlling the gate of the at least one transistor cell 101 based on a current measured in the electrically conductive via structure 523, for example.

The gate driver circuit (which may be a separate circuit or part of the controller module 213) may be connected to a gate (or a gate contact structure) of a first transistor cell (or a first subset of a plurality of transistor cells located in the first semiconductor chip 521) through a flip-chip connection structure. The gate driver circuit may be located at the first side surface 524 of the semiconductor substrate of the further semiconductor chip 522. For example, the gate driver circuit may be flip-chip bonded (or soldered) to the gate contact structure 414 contacting the gate of the first transistor cell 101 (or the first subset of the plurality of transistor cells), for example.

The first semiconductor chip 521 (e.g. the IGBT chip) may be bump bonded to the second semiconductor chip 522 (e.g. the gate-driver chip) with two bumps per transistor cell, for example. The gate contact structure 414 of the transistor cell 101 may be contacted to a gate driver region of the gate-driver chip 522 while the emitter may be contacted to the through-silicon via (TSV) structure 523, for example. A ring electrode structure of the sensing circuit 212 located around the TSV structure 523 may be used to monitor the current through the transistor cell 101. The current monitor (e.g. the sensing circuit 212) may be connected to the gate driver layer 528 located at the first side surface 524 of the second semiconductor chip 522, for example.

Optionally, in the case of the transistor cell 101 being a lateral transistor cell, the first emitter/collector or source/drain regions may be connected to a first metallization layer located on the further (second) semiconductor chip 522 via the first electrically conductive via structure 523. The second emitter/collector or source/drain region may be connected to a second (different) metallization layer located on the same semiconductor chip via a second electrically conductive via structure, for example.

Electrically insulating material 634 may electrically insulate the gate driver layer 528 and/or the current sensing circuit 212 from the one or more metallization layers 616C formed on the second side surface 525 of the semiconductor substrate of the second semiconductor chip 522, for example.

More details and aspects are mentioned in connection with the embodiments described above or below. The embodiments shown in FIG. 6A may comprise one or more optional additional features corresponding to one or more aspects mentioned in connection with the proposed concept or one or more embodiments described above (e.g. FIGS. 1 to 5) or below (e.g. FIG. 7).

FIG. 6B shows a schematic illustration of a further semiconductor device 650 according to an embodiment.

The semiconductor device 650 may be similar to the semiconductor device 600 described in connection with FIG. 6A.

Optionally or alternatively, the gate driver circuit (or the controller module 213) and/or the sensing circuit 212 may be located at the second side surface 525 of the semiconductor substrate of the further semiconductor chip 522 instead of at the first side surface 524. At least one further electrically conductive via structure 633 (e.g. a TSV structure) extending from the first side surface 524 towards the second side surface 525 of the further semiconductor chip 522 may connect the controller module 213 to the further flip-chip connection structure 627, for example. The gate driver circuit (or the controller module 213) and/or the sensing circuit 212 may be electrical insulated from one or more metallization layers 616C (e.g. emitter metal) formed on the second side surface 525 of the semiconductor substrate of the second semiconductor chip 522 by electrically insulating material 634.

More details and aspects are mentioned in connection with the embodiments described above or below. The embodiments shown in FIG. 6B may comprise one or more optional additional features corresponding to one or more aspects mentioned in connection with the proposed concept or one or more embodiments described above (e.g. FIGS. 1 to 6A) or below (e.g. FIG. 7).

FIG. 7 shows a flow chart of a method 700 for controlling a vertical field effect transistor arrangement of a semiconductor device.

The method 700 may include forming 710 a plurality of transistor cells of a vertical field effect transistor arrangement, wherein a gate of a first transistor cell and a gate of a second transistor cell of the plurality of transistor cells are controllable by different gate control signals at the same time.

Due to a gate of a first transistor cell and a gate of a second transistor cell of the plurality of transistor cells being controllable by different gate control signals at the same time, switching losses (e.g. due to over-voltage) may be reduced, for example. For example, the transistor cells may be dynamically adapted to the different load currents.

Additionally or optionally, the first transistor cell of the plurality of transistor cells and the second transistor cell of the plurality of transistor cells may be electrically connected in parallel, for example.

Additionally or optionally, the gate of the first transistor cell and the gate of the second transistor cell may be controllable by different gate control signals during a predetermined time interval, for example.

More details and aspects are mentioned in connection with the embodiments described above or below. The embodiments shown in FIG. 7 may comprise one or more optional additional features corresponding to one or more aspects mentioned in connection with the proposed concept or one or more embodiments described above (e.g. FIGS. 1 to 6B) or below.

Various examples relate to cellular power devices and/or IGBT transistor cells with granular control logic, for example. Various examples relate to a real time control of the current distribution in IGBT transistor cells or MOSFET transistor cells, for example. Various examples relate to a granular gate driver where each (transistor) cell may have its own gate driver cell, for example. Various examples further relate to a plurality of transistor (e.g. IGBT) cells connected in parallel. For example, one gate driver cell and one current monitor may be allocated for the control of a single transistor cell or for the control of a subset (of one or more) transistor (IGBT) cells.

Aspects and features (e.g. the vertical field effect transistor arrangement, the plurality of transistor cells, the first transistor cell, the subset of transistor cells comprising the first transistor cell, the second transistor cell, the subset of transistor cells comprising the second transistor cell, the controller module, the first gate driver circuit, the second gate driver circuit, the sensing circuit, flip-chip connection, the first semiconductor chip and the second semiconductor chip) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first transistor cell of a plurality of transistor cells of a vertical field effect transistor arrangement; and
   a second transistor cell of the plurality of transistor cells;
   wherein the first transistor cell and the second transistor cell are electrically connected in parallel,
   wherein a gate of the first transistor cell and a gate of the second transistor cell are controllable by different gate control signals.

2. The semiconductor device of claim 1, wherein a first gate control signal generated by a controller module provides a first gate voltage to the gate of the first transistor cell, and wherein a second gate control signal generated by the controller module provides a second gate voltage to the gate of the second transistor cell during a same time interval.

3. The semiconductor device of claim 1, wherein the different gate control signals are generated by a controller module based on a current of the first transistor cell or on a current of a subset of transistor cells of the plurality of transistors cell comprising the first transistor cell.

4. The semiconductor device of claim 1, wherein the different gate control signals are generated by a controller module based on a current of an emitter/collector or source/drain contact structure contacting the first transistor cell or a subset of transistor cells of the plurality of transistors cell comprising the first transistor cell.

5. The semiconductor device of claim 4, wherein the current of the emitter/collector or source/drain contact structure is determined by a sensing circuit arranged in proximity to the emitter/collector or source/drain contact structure.

6. The semiconductor device of claim 1, wherein the different gate control signals are generated by a controller module based on a temperature of the first transistor cell or on a temperature of a subset of transistor cells of the plurality of transistors cell comprising the first transistor cell.

7. The semiconductor device of claim 1, wherein the first transistor cell is part of a first subset of the plurality of transistors cells controllable by a first gate control signal, and wherein the second transistor cell is part of a second subset of the plurality of transistor cells controllable by a second gate control signal.

8. The semiconductor device of claim 7, wherein the first subset of the plurality of transistors cells and the second subset of the plurality of transistors cells each comprises more than five transistor cells.

9. The semiconductor device of claim 1, further comprising:
   a first gate contact structure for connecting at least the gate of the first transistor cell to a first gate driver circuit of a controller module providing the different gate control signals; and
   a second gate contact structure for connecting at least the gate of the second transistor cell to a second gate driver circuit of the controller module.

10. The semiconductor device of claim 9, wherein the controller module and the plurality of transistor cells are part of the same semiconductor chip.

11. The semiconductor device of claim 10, wherein the controller module is located in a semiconductor layer, and wherein the semiconductor layer is located in the semiconductor chip and/or between a lateral side of the semiconductor chip and a metallization layer located on the lateral side of the semiconductor chip.

12. The semiconductor device of claim 9, wherein the first gate contact structure and the second gate contact structure each comprises at least one flip-chip connection structure for providing a flip-chip connection to a semiconductor chip comprising the controller module.

13. The semiconductor device of claim 1, wherein each transistor cell of the vertical field effect transistor arrangement comprises a vertical metal oxide semiconductor field effect transistor structure, a vertical insulated gate bipolar transistor structure or a vertical thyristor structure.

14. A semiconductor device, comprising:
    a plurality of transistor cells;
    a sensing circuit configured to determine a current or a temperature through at least one transistor cell of the plurality of transistor cells; and
    a controller module configured to generate a gate control signal for controlling a subset of the plurality of transistor cells based on the determined current through the at least one transistor cell.

15. The semiconductor device of claim 14, wherein the sensing circuit is arranged in proximity to a portion of an emitter/collector or source/drain contact structure contacting at least the at least one transistor cell.

16. The semiconductor device of claim 14, wherein the sensing circuit comprises a ring electrode sensing circuit or a shunt sensing circuit configured to determine the current through the at least one transistor cell, or a temperature diode or a circuit comprising a positive temperature coefficient element configured to determine the temperature through the at least one transistor cell.

17. A semiconductor device, comprising:
a plurality of transistor cells of a vertical field effect transistor arrangement,
wherein a gate of a first transistor cell of the plurality of transistor cells and a gate of a second transistor cell of the plurality of transistor cells are controllable by different gate control signals,
wherein a blocking voltage of the vertical field effect transistor arrangement is at least 10 V.

18. A semiconductor device, comprising:
a first semiconductor chip comprising at least one transistor cell; and
a second semiconductor chip comprising a controller module for controlling a gate of the at least one transistor cell,
wherein the second semiconductor chip comprises an electrically conductive via structure extending between a first side surface of a semiconductor substrate of the second semiconductor chip towards a second side surface of the semiconductor substrate of the second semiconductor chip,
wherein the electrically conductive via structure is connected to the at least one transistor cell of the first semiconductor chip through a flip-chip connection structure.

19. The semiconductor device of claim 18, wherein the controller module is connected to the gate of the at least one transistor cell through a further flip-chip connection structure.

20. The semiconductor device of claim 18, wherein the controller module is configured to generate a gate control signal for controlling the gate of the at least one transistor cell based on a current measured in the electrically conductive via structure.

* * * * *